United States Patent [19]

Mosier

[11] 4,338,649
[45] Jul. 6, 1982

[54] SYSTEM FOR REMOTELY CONTROLLING A LOAD

[75] Inventor: Douglas R. Mosier, White Bear Lake, Minn.

[73] Assignee: Minnesota Mining and Manufacturing Company, St. Paul, Minn.

[21] Appl. No.: 201,742

[22] Filed: Oct. 29, 1980

[51] Int. Cl.³ .............................................. H01H 47/22
[52] U.S. Cl. .................................. 361/139; 361/160; 361/191
[58] Field of Search ...................... 361/139, 179–181, 361/160, 175, 189, 191, 205, 206

[56] References Cited

U.S. PATENT DOCUMENTS

| 2,695,378 | 11/1954 | Irvin . |
| 2,866,925 | 12/1958 | Wunderman . |
| 2,950,423 | 8/1960 | Lovegrove . |
| 3,018,421 | 1/1962 | Hodgson . |
| 3,026,448 | 3/1962 | Brown . |
| 3,069,601 | 12/1962 | Eidam . |
| 3,458,892 | 8/1969 | Kobayashi et al. . |
| 3,461,354 | 8/1969 | Bollmeier . |
| 3,643,134 | 2/1972 | Beling . |
| 3,742,313 | 6/1973 | Spencer . |
| 3,774,191 | 11/1973 | Enemark . |
| 3,808,456 | 4/1974 | Kay et al. . |
| 3,858,094 | 12/1974 | Hanchett, Jr. ...................... 361/191 |
| 3,869,651 | 3/1975 | Long et al. . |
| 3,999,106 | 12/1976 | Kratomi . |
| 4,026,048 | 5/1977 | Hill et al. . |
| 4,051,547 | 9/1977 | Wood . |

FOREIGN PATENT DOCUMENTS 2902443 10/1979 Fed. Rep. of Germany .

Primary Examiner—Harry E. Moose, Jr.
Attorney, Agent, or Firm—Cruzan Alexander; Donald M. Sell; William D. Bauer

[57] ABSTRACT

A system adapted to remotely control a transformer relay. The load switch of a transformer relay is controlled by controlling the direction of current flow in the secondary winding. A switch module is coupled with two wires to the secondary winding of the transformer relay providing a unidirectional current flow above a predetermined threshold in the secondary winding in response to a control signal. The unidirectional current flow may be selectively controlled in either direction or may be only purely unidirectional. A control module is then coupled to the switch module momentarily producing the control signal in response to an external stimulus. The switch module, the control module, or both draw a quiescent current from the secondary winding of the transformer relay when the switch module is not activated. The quiescent current is of an amount which is less than the predetermined threshold. In one embodiment the voltage and current at the control device are limited to values less than those available at the secondary winding of the transformer relay.

42 Claims, 16 Drawing Figures

SYSTEM FOR REMOTELY CONTROLLING A LOAD

BACKGROUND OF THE INVENTION

The present invention relates generally to electromechanical switching systems and particularly to electronic systems for controlling transformer relays. In a preferred embodiment the transformer relay has at least two stable states which are dependent upon the direction of unidirectional current flow above a predetermined threshold in the secondary winding of the transformer relay.

There exist in the prior art various types of transformer relays. These transformer relays are generally capable of the remote switching of a load. The transformer relay has a primary winding and a secondary winding. A load switch is mechanically and magnetically coupled to the transformer relay core through the armature and the load is connected in series with the load switch while the primary winding of the transformer relay is coupled to a power source. The transformer relay has two stable states. One of the stable states is realized when the current flow in the secondary winding is restricted to a first direction and exceeds a predetermined threshold, and a second stable state is realized when the current flow in the secondary winding is restricted to the other direction and exceeds the predetermined threshold. Of course, the function of a transformer relay may be realized with the transformer and the relay actually physically constructed in separate physical packages. A transformer relay function is provided whenever a transformer and a relay are coupled in a manner in which the state of the relay is determined by the current flowing in the transformer.

One example of a prior art transformer relay is illustrated in the United States patent application Ser. No. 034,381, BAKER et al, LOW VOLTAGE TRANSFORMER RELAY, filed Apr. 30, 1979 and assigned to the assignee of the present application. The Baker transformer relay is of the type which has a unitized transformer and relay package. The relay is magnetically latched and directional current flowing above a predetermined threshold in the secondary winding controls the position of the load switch. Generally, the voltage and current present in the secondary winding are less than the voltage and current which are available at the power source to which the primary winding is connected. In a typical case, the primary winding of the transformer relay may be connected to a 120 volt alternating current source capable of supplying 15 to 20 amperes, while the secondary winding of the transformer relay may supply approximately 15 volts and around 100 milliamperes of current.

An example of a switching system to control a transformer relay is illustrated in U.S. Pat. No. 3,461,354, Bollmeier, issued Aug. 12, 1969 and assigned to the assignee of the present application. The switching mechanism disclosed for controlling the transformer relay in the Bollmeier patent uses a double pole, double throw switch with the common terminals of the double throw switch coupled to each side of the secondary winding. A diode is coupled across two switched terminals of the double throw switch which are in turn cross-coupled to the other switched terminals to allow selective directional current flow in the secondary winding depending upon the position of the double pole, double throw switch. Similar results may be obtained with a single pole, double throw switch with common terminal coupled to one side of the secondary winding and the switched terminals coupled to the other side of the secondary winding through diodes of opposite polarity. An example of this latter arrangement is illustrated in the Baker et al patent application.

Many conditions exist where there is a need to control the transformer relay secondary winding with a control circuit or control device which is insufficient to meet the control criteria of the secondary winding of the transformer relay. That is, not only must the directional current be established in the secondary winding in order to switch the transformer relay, but a directional current flow of sufficient amplitude to switch the magnetic structure, i.e. a directional current above a predetermined threshold, must be obtained.

For purposes of safety, certain wet locations need a very limited voltage and current. That it, if a location is determined to be wet, then the maximum amount of voltage allowed to be present at that location as well as the maximum amount of current allowed to be drawn at that location must be limited if that location is to remain absolutely safe. Examples of these wet locations include, but certainly are not limited to, hot tubs, bathrooms, and certain outdoor locations.

Another condition exists where the control to the secondary winding of the transformer relay is insufficient. This occurs where either the voltage or the drive capability of the control device is insufficient to operate the transformer relay. This could occur very easily where it would be desired to have a computer or a microprocessor operate the transformer relay or a whole series of transformer relays.

Another case of insufficient control to the transformer relay exists where the control device is simply incompatable with the transformer relay secondary. An example of this kind of incompatibility would be in the use of timers or sensors to control the transformer relay. Such sensors could be derived from a number of external stimula, including light, infrared, thermal, ultrasonic and microwave.

Another example of incompatibility is where the control desired is merely a unidirectional control. Examples of unidirectional control would be blackout protectors to switch off a particular piece of equipment, should power be interrupted, to protect it from voltage or current surges should power suddenly be reapplied, and any equipment which needs to be preset, either to an "on" or an "off" condition as power is applied. A control circuit may be desired to assure that the transformer relay would energize into the appropriate state.

Another example of the insufficiency of the control media to interface directly to the transformer relay, is the inability to adapt to certain standard controls which already exist. An example is the switching of a lighting or equipment load with a transformer relay using a standard single pole, single throw wall switch as a control device. Note that the Bollmeier control requires a double throw switch in this installation, and thus cannot be used in existing applications without modification of the switch.

Still another example of the insufficiency of the control media is related to the use of a multiplicity of control devices. The problem is that the total leakage current through the control devices must be kept below the minimum switching level, threshold, of the transformer relay secondary winding. Although the leakage current through a single control device may be well below that amount of current which would switch the transformer relay, the connection of a large plurality of controls may cause that leakage current to surpass the minimum switching threshold. The problem is especially apparent where the control device itself is drawing its power from the secondary winding of the transformer relay, a common and desirable situation.

Still another example of insufficient control of the transformer relay is the case where a plurality of control devices are utilized to control one transformer relay and those control devices are of different types; perhaps requiring differing interface characteristics. For example, it may be desirable to utilize automatic timers along with manual wall switches to control a lighting situation. Another example would be where a given load may be controlled from switches, some of which are located in dry locations and some of which are located in wet locations. In this instance, it would be necessary to install a safe switch in the wet locations, but certainly not necessary to install such a safe switch in the dry locations. Still another example of differing types of controls to be utilized with one transformer relay is a computer control also coupled with a blackout circuit protector. In this situation, the computer will have normal control over the operation of the load while a blackout protector may also be connected to the transformer relay to ensure that the load being controlled is protected in the case of a power interruption.

SUMMARY OF THE INVENTION

A system is provided for controlling a transformer relay in response to an external stimulus. The transformer relay typically has a primary winding coupled to an energy source, and has a load switch adapted to control the application of the energy source to a load. The transformer relay also typically has a secondary winding which controls the load switch dependent upon the unidirectional flow of current above a predetermined threshold in the secondary winding. A switch module is coupled to the secondary winding with two wires, for allowing, in response to a control signal, a unidirectional current flow in the secondary winding of an amount exceeding the threshold. A control module is then operatively coupled to the switch module for momentarily producing the control signal in response to the stimulus. The switch module and the control module are powered from the secondary winding and together draw a quiescent current of an amount less than the threshold from the secondary winding. In this way, the transformer relay is controlled utilizing only two wires between the secondary winding and the switch module and whereby the control signal may be a signal other than a unidirectional flow of current.

In one embodiment, a plurality of control modules are operatively coupled in parallel with each other so that the transformer relay may be controlled from any one of a plurality of control modules. In another embodiment a plurality of switch modules are operatively coupled in parallel with each other with each of the plurality of switch modules having an associated control module so that the transformer relay may again be controlled from any one of the associated control modules.

The switch module may provide selective unidirectional current flow in either direction or only in a single direction. The former case is an example of a system which would control the transformer relay to switch a load. The latter case is an example of a system in which a blackout protector would be utilized to ensure that a load is in a certain state when power is applied, i.e. where control to the transformer relay to only one state is required. The switch module in the former embodiment may be a bidirectional switch such as a solid state switch, a triac or combinations of silicon controlled rectifiers, transistors or relays coupled in opposite directions.

Differing types of control signals are contemplated. In one embodiment the control signal is a unidirectional current flow in a loop formed with two wires coupling the control module with the switch module. That is, a current above a predetermined threshold in a first direction in the loop made of the two wires would indicate a control signal desiring the transformer relay to go to a first state where the opposite direction of current would indicate a control signal indicating the desirability of switching the transformer relay to a second state. In another embodiment, the control signal is a voltage level on a plurality of wires interconnecting the switch module with the control module. An example is a two-way switching system utilizing three wires. In this system, one wire is a reference and the other two wires are control lines. A voltage of a sufficient magnitude with respect to the reference wire present on one of the control wires would indicate a control signal desiring to switch the transformer relay to one of its stable states. A similar condition exists with respect to the other control wire indicating a control signal desiring to switch the transformer relay to the other of its stable states. Of course, where only unidirectional control of the transformer relay is required, only one control wire with a reference wire is needed. In still another embodiment, the control module could be optically coupled to the switch module. It is contemplated that the switch module, the control module, or both, obtain their power from the transformer relay secondary winding. The quiescent current drawn during a non-switching action must, of course, be less than the predetermined threshold of the switching current of the transformer relay. In this configuration the control module could either obtain the power through the switch module or obtain it by means of a separate power supply coupled between the secondary winding of the transformer relay and the control module itself. This could provide, for example, either a half wave rectified or a full wave rectified, and possibly filtered, power supply source to supply components located in the control module and in the switch module.

The switch module may also provide either voltage or current limiting characteristics, or both, to the control module. If the current and voltage obtainable at the control module is limited to a predetermined amount which is within tolerable safety limits, then the user of a control device in a hazardous location is protected from a malfunction in the control module. Thus, the voltage and current obtainable at the control module may be limited to a lower voltage and a lesser current than that present at the secondary winding. At the same time, sufficient unidirectional current is provided within the switch module to switch the transformer relay, i.e. above the predetermined threshold. Typical of this system is a preferred embodiment in which only two wire control is utilized between the transformer relay secondary winding and the switch module, and also between the switch module and the control module. Thus, in respect to a lighting circuit, existing standard two wire wiring may be utilized to provide a safe switch at a hazardous location.

BRIEF DESCRIPTION OF THE DRAWINGS

The foregoing advantages, construction and operation of the present invention will become more readily apparent from the following description and accompanying drawings in which.

DESCRIPTION OF THE PREFERRED EMBODIMENTS

Figure 1:
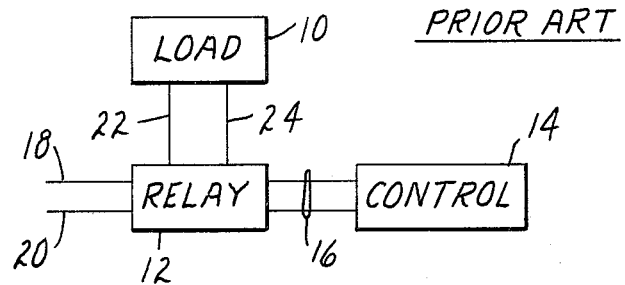
FIG. 1 is a block diagram of a prior art system.

FIG. 1 illustrates a block diagram of a prior are switching system utilizing a transformer relay. The figure illustrates a load 10 which is to be switched by transformer relay 12 in response to a control module 14. Communication between control module 14 and transformer relay 12 is accomplished by communication wires 16. The transformer relay 12 is coupled to a primary power source utilizing wires 18 and 20. The load 10 is coupled to the load switch of the transformer relay 12 by way of wires 22 and 24.

Figure 2:
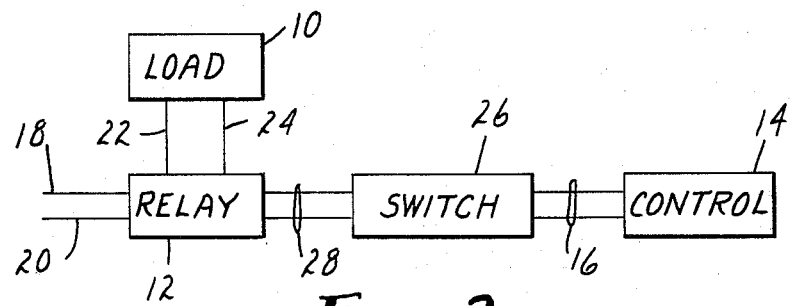
FIG. 2 is a block diagram of a system of the present invention.

FIG. 2 illustrates a block diagram of a system utilizing the same load 10, the same transformer relay 12 and the same control module 14. Again, the control module 14 supplies communication lines 16 with a control signal while the transformer relay 12 is coupled to a primary power source utilizing wires 18 and 20. Also, the load 10 is coupled to the load switch of the transformer relay 12 utilizing wires 22 and 24. A switch module 26 is coupled to the communication lines 16 and to the secondary winding of the transformer relay 12 utilizing communication lines 28. In one embodiment, the control module 14 supplies control signals on communication lines 16 to instruct the switch module 26 to allow a predetermined current in communication lines 28 which in turn are coupled to the secondary winding of the transformer relay 12 which will control the load switch coupled to the load 10. Communication lines 28 represent a two-wire interface between the transformer relay 12 and the switch module 26. Switch module 26, and in one embodiment control module 14, draws a quiescent current on communication lines 28 from the transformer relay 12.

Figure 3:
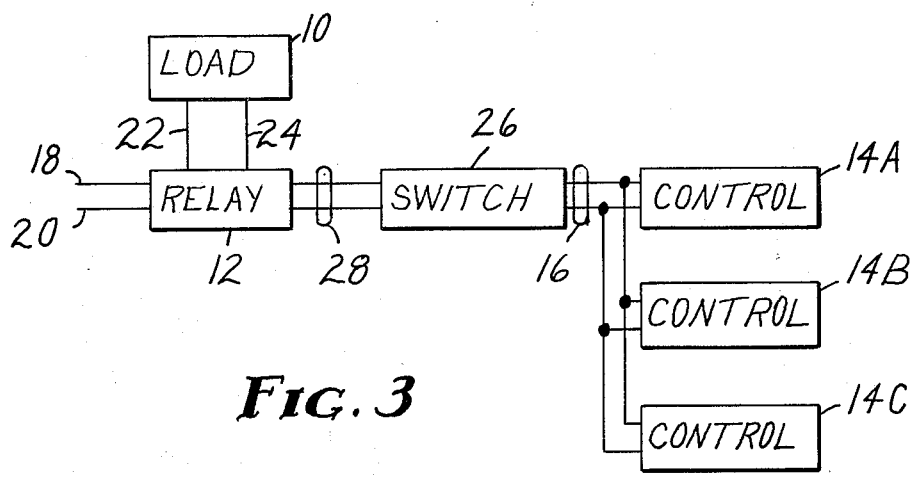
FIG. 3 is a block diagram of a system showing the use of multiple control modules.

FIG. 3 illustrates by block diagram the use of multiple control modules 14 to control a single transformer relay 12. Again, as in FIG. 2, the switch module 26 is coupled to the secondary winding of the transformer relay 12 with a two-wire interface on communication lines 28. Again, the load 10 is coupled to the load switch of the transformer relay 12 utilizing wires 22 and 24 and still again, the transformer relay 12 is coupled to a primary power source using wires 18 and 20. Control modules 14A, 14B, and 14C are all coupled to switch module 26 using communication lines 16. Since control modules 14A, 14B and 14C are all coupled in parallel over the same communication lines 16, any one of the control modules 14A, 14B, and 14C may supply a control signal along communication lines 16 to the switch module 26 which in turn may control the state of the transformer relay 12.

Figure 4:
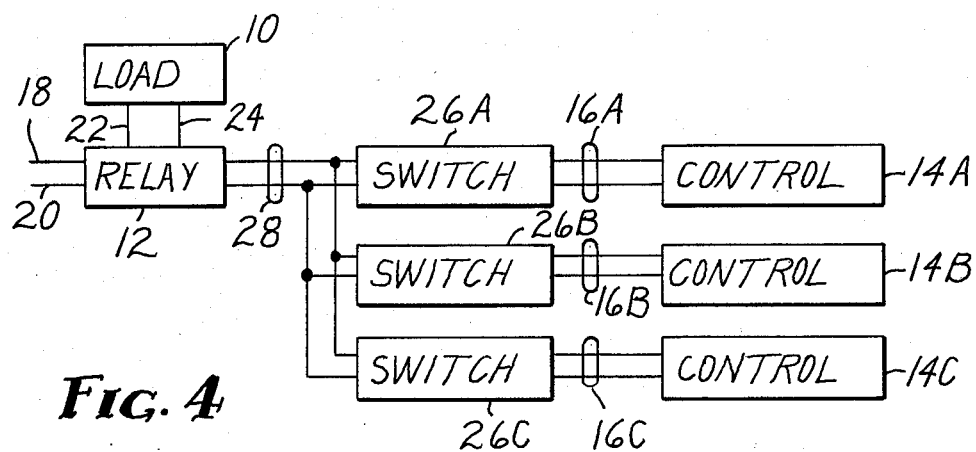
FIG. 4 is a block diagram of a system showing the use of multiple switch modules.

FIG. 4 illustrates by a block diagram the use of multiple switch modules 26 coupled to a single transformer relay 12. Again, as in FIGS. 2 and 3, the load 10 is coupled to the load switch of the transformer relay 12 utilizing wires 22 and 24 and the transformer relay 12 is coupled to a primary power source using wires 18 and 20. In FIG. 4, switch modules 26A, 26B and 26C are all coupled to the secondary winding of the transformer relay 12 utilizing the same two-wire communication lines 28. Switch modules 26A, 26B and 26C collectively must draw a quiescent current which is lower than the threshold current in the loop constrained by communication lines 28 to switch the transformer relay 12. However, any one of the switch modules 26A, 26B and 26C may switch the state of the transformer relay 12 by allowing a unidirectional current flow of a magnitude above the predetermined threshold in the loop formed between the appropriate switch module (26A, 26B or 26C) with communication lines 28 to the transformer relay 12. Separate control modules 14 are shown associated with each switch module 26. Control module 14A is coupled to switch module 26A using communication lines 16A. Control module 14B is coupled to switch module 26B using communication lines 16B. Control module 14C is coupled to switch module 26C using communication lines 16C.

While FIG. 3 illustrates a plurality of control modules 14, which may be utilized with a single switch module 26 to provide for multiple control, and FIG. 4 illustrates that a plurality of switch modules 26 may be utilized with a single transformer relay 12 to provide for multiple control, it is understood that the present invention may be utilized in parallel with other control circuits, such as those described in the Bollmeier patent and the Baker et al patent application. Thus the advantages in the construction of the present invention may be obtained from all control locations or only a part of those control locations. Use of a switch module 26 of the present invention does not preclude the use of other types of control circuits to the secondary winding of the transformer relay 12 as long as they are activated momentarily and not continuously, and that they draw a sufficiently low quiescent current.

Figure 5:
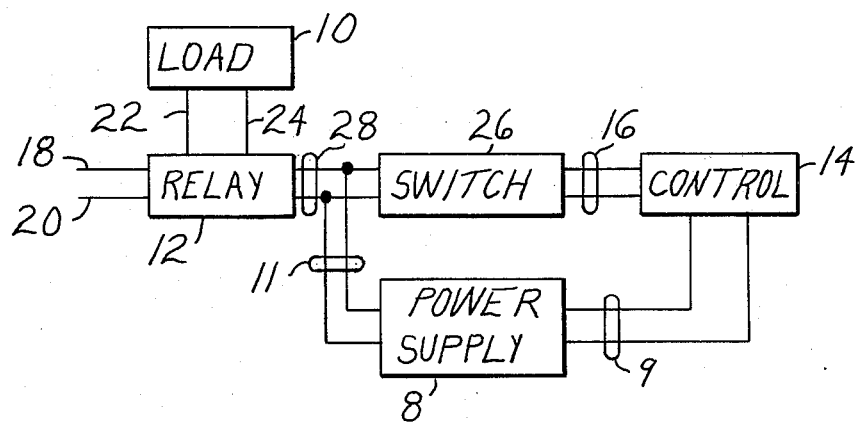
FIG. 5 is a block diagram of a system illustrating separate power supply lines for the control module.

FIG. 5 illustrates by a block diagram a source of power for a control module 14 other than that obtained directly through the switch module 26. A power supply 8 is coupled directly to the secondary winding in the transformer relay 12 with wires 11. The power supply 8 then supplies power directly to the control module 14 by way of wires 9. The power supply 8 may be necessary where a control module 14 contains active semiconductor devices requiring a direct current power source which the power supply 8 may convert from the alternating current power in the secondary winding of the transformer relay 12. In this configuration, any quiescent current drawn by switch module 26 and drawn by power supply 8 must together be less than the threshold current in the secondary winding of the transformer relay 12.

Figure 6:
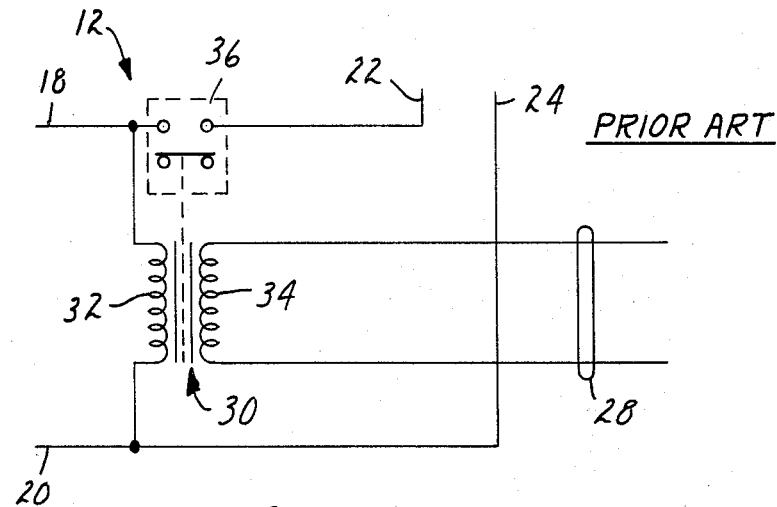
FIG. 6 is a schematic representation of a prior art transformer relay.

FIG. 6 illustrates a schematic representation of a prior art transformer relay. Illustrated are lines 18 and 20 which connect the transformer relay 12 to a primary power source. Also shown are lines 22 and 24 which are utilized to connect the transformer relay to the load 10. The other input to the transformer relay 12 are communication lines 28 which go to the switch module 26. Transformer relay 12 is shown constructed of a transformer core 30 having a primary winding 32 and a secondary winding 34. The primary winding 32 is coupled between power lines 18 and 20 while the secondary winding 34 is coupled to communication lines 28. A load switch 36 is magnetically coupled to the transformer core 30. One side of the load switch 36 is coupled to the power line 18 while the other side of the load switch 36 goes directly to line 22 and subsequently to the load 10. Transformer relay 12 has two stable states and is stable as long as the current flowing in the secondary winding 34 is less than a predetermined threshold. One of the stable states is with the load switch 36 positioned open and the other stable state is with the load switch 36 positioned closed. The two stable states of the transformer relay 12 are controlled by the direction of current flow in the secondary winding 34. When the current flow of the secondary winding 34 is limited to a first direction and is above the predetermined threshold, action of the transformer relay 12 causes load switch 36 to close while a current in the secondary winding 34 in the other direction and above the predetermined threshold will cause the load switch 36 to open.

While the transformer relay 12, as shown in schematic form in FIG. 6 is contained within a single package, it is apparent to one of ordinary skill in the art that the same function could be made available with a separate transformer and a separate relay.

Figure 7:
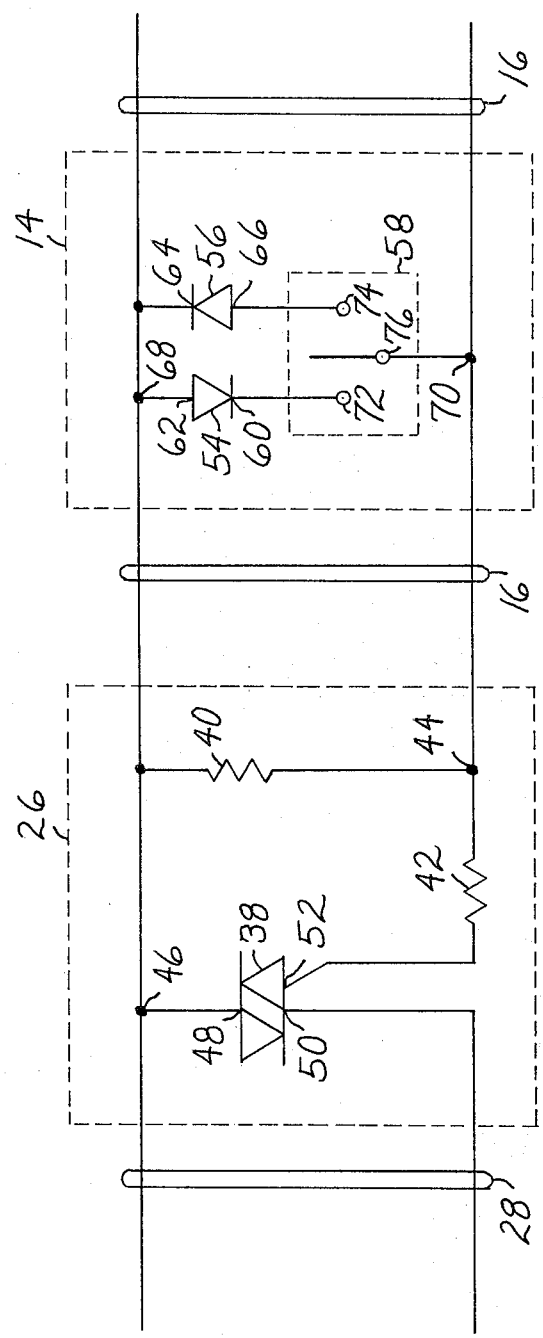
FIG. 7 is a schematic representation of an energy limiting switch module coupled to a control module.

A switch module 26 with energy limiting characteristics and control module 14 are illustrated in FIG. 7. It has been shown that in some instances it is necessary to have a switch module 26 which has energy limiting characteristics. The switch module 26 is coupled to the transformer relay 12 through communication lines 28 which are coupled directly to the secondary winding 34. The control module 14 is coupled to the switch module 26 with a pair of communication lines 16. Note that communication lines 16 are passed directly through the control module 14 enabling a plurality of control modules as in FIG. 3 to be coupled in parallel providing for control at a plurality of locations.

The control module 14 illustrated in FIG. 7 is the type of double throw switch and diode pair which is illustrated in the Baker et al patent application. Communication lines 16 at the left couple to the switch module 26. A double throw switch 58 is shown with a common terminal 76 coupled to one side 70 of communication lines 16. The other side 68 of communication lines 16 is coupled both to anode 62 of diode 54 and to cathode 64 of diode 56. In turn, the cathode 60 of diode 54 is coupled to terminal 72 of switch 58, while the anode 66 of diode 56 is coupled to the terminal 74 of switch 58. When the common terminal 76 of switch 58 is connected to terminal 72, current will flow only from side 68 to side 70 causing current to flow in a loop containing communication wires 16 in one direction. And when common terminal 76 is coupled to terminal 74 of switch 58, current is allowed only to flow from side 70 to side 68 causing current in the loop containing communication line 16 to flow in the other direction only.

In switch module 26, a triac 38 is coupled across communication lines 28 with terminal 48 of the triac coupled to one side 46 of the secondary winding 34 of the transformer relay 12. This side 46 is also passed directly through to communication lines 16. Terminal 50 of triac 38 is then coupled to the other side of the secondary winding 34 of the transformer relay 12. The triac 38 has a gate terminal 52 which controls the operation of the triac 38 and determines whether it allows conduction from terminal 48 to terminal 50, from terminal 50 to terminal 48, or not at all. Resistors 40 and 42 form a voltage division network. Resistor 42 is connected to the gate terminal 52 of the triac 38 while resistor 40 is coupled across communication lines 16. The direction of current flow present in the loop formed with communication lines 16 will determine the direction of current which will be allowed in triac 38. Thus, the switch module 26 operates as an intermediary between the control module 14 and the transformer relay 12.

Resistors 40 and 42 form a voltage division network. The voltage present between point 46 and point 44 is determined by the ratio of the value of resistor 40 divided by the sum of the values of resistor 40 and resistor 42. Thus, the voltage present at communication lines 16 and thus available to a control module 14 can be made a portion of that voltage present from the secondary winding of the transformer relay 12. Similarly, the current which is allowed to flow through communication lines 16 is limited by the value of resistor 42. Since resistor 42 prevents a short circuit on the output of the secondary winding of the transformer relay, the amount of current available through the control module 14 is necessarily further limited. This current is actually the amount of voltage present across the secondary winding of the transformer relay 12 minus the amount of any voltage drop across the control module 14 divided by the sum of the resistance of resistor 42, the resistance between terminals 50 and 52 of triac 38, and the internal resistance in the secondary winding 34. This provides energy limiting characteristics at communication lines 16 which are not present at communication lines 28. This conversion results in the double benefit of having enough current available at communication lines 28 to effectively operate the transformer relay 12 while limiting the amount of voltage and current present at communication lines 16 in order to present a safe environment to a control module 14.

The selection of the values for resistors 40 and 42 are governed by the following four characteristics. First, as stated above, the combination of the values of resistors 40 and resistor 42 limit the voltage available at the control module 14 by a voltage division effect. Thus, the proper ratio of the value of resistor 40 to the sum of the values of the resistances of resistors 40 and 42 must be controlled to provide the proper voltage limiting characteristic. Second, resistor 42 must be large enough to limit the total possible current passing through control module 14 on communication lines 16, providing the current limiting characteristic. Third, the value of resistor 42 must be small enough so that the current flowing through the gate terminal 52 of triac 38 when the control module 14 is activated is large enough so that the triac 38 can be triggered. Fourth, with the control module 14 deactivated the values of resistors 40 and 42 combined must be large enough to limit the quiescent current drawn from the secondary winding of the transformer relay 12 through communication lines 28 to an amount low enough such that the current then passing through gate terminal 58 of triac 38 does not allow the triac 38 to be triggered under this quiescent condition. Notice that the switch module 26 draws a quiescent current through communication lines 28 from the secondary winding of the transformer relay 12 even when the control module 14 is not activated. This quiescent current is desirable in order to provide power to the components of the switch module 26 but must be less than that necessary to trigger the triac 38 and less than the predetermined threshold current of the transformer relay 12.

As an example, when the secondary winding 34 of the transformer relay 12 has a nominal voltage available of 15 volts and is capable of supplying 150 milliamperes of current, assume that it is desirable to have a control module 14 across which at no time is it possible to have present more than 12 volts, and through which at no time is it possible to draw more than five milliamperes, an amount generally considered to be non-hazardous to humans. Consequently, the triac 38 has been selected to switch with less than five milliamperes of gate current with a gate drop of about 0.6 volts. With these assumptions and with the selection criteria given, resistor 40 may be selected to be approximately 3,600 ohms, and resistor 42 may be selected to be approximately 20,000 ohms.

Although the voltage divider in FIG. 7 has been illustrated by resistor 40 in parallel with communication lines 16, and a resistor 42 in series with communication lines 16 (between point 44 and gate 52), it is understood that other specific forms of voltage division are contemplated. For example, resistor 42 (the series resistance) could be placed between resistor 40 and point 46 to obtain the same results. Alternatively, a combination may be used with a portion of the series resistance placed above and below resistor 40. Many other combinations of resistors may be utilized to perform the same function. As long as the effective parallel resistance of the voltage divider is the value of resistor 40 and the effective series resistance is the value of resistor 42, the desired result will be obtained.

Figure 8:
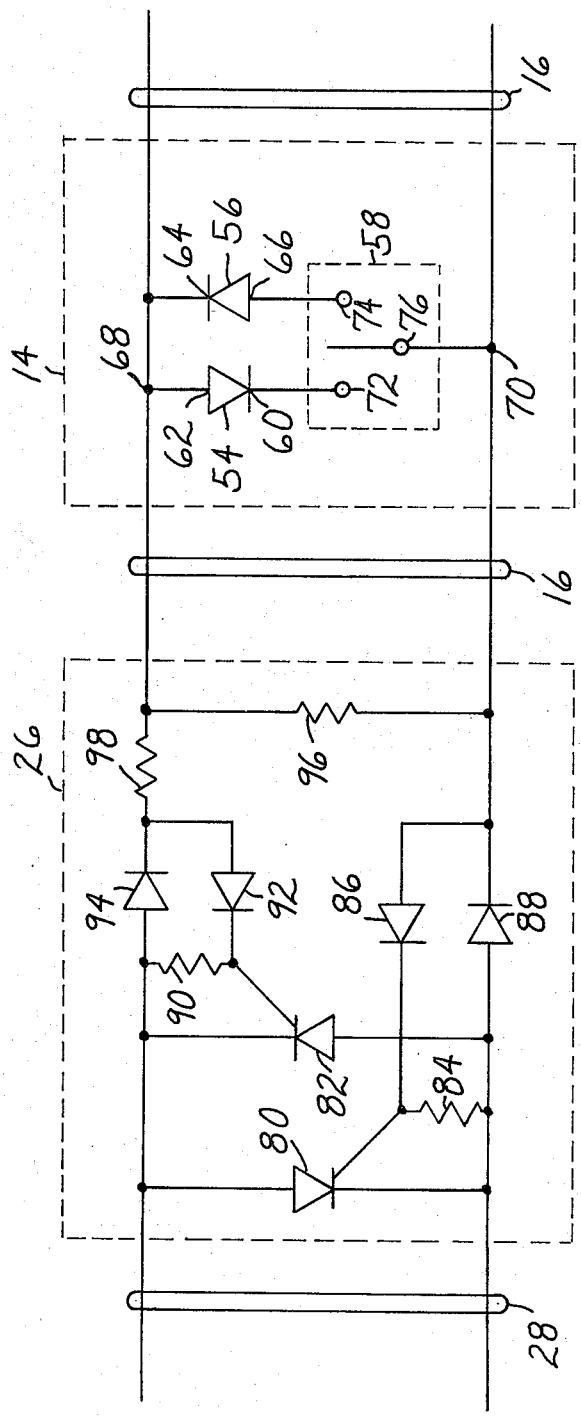
FIG. 8 is a schematic representation of a switch module utilizing two silicon controlled rectifiers with energy limiting characteristics and the same control module as in FIG. 7.

FIG. 8 illustrates a system having a switch module 26 utilizing dual SCR's (Silicon Controlled Rectifiers) instead of a triac and a control module 14 identical to the control module of FIG. 7. As can be seen in the figure, SCR 80 and SCR 82 are both coupled across communication lines 28 with SCR 80 allowing current to flow only from top to bottom and with SCR 82 allowing current to flow only from bottom to top in the diagram. The gate terminal to SCR 80 is coupled through resistor 84 back to its own cathode. Diodes 88 and 94 couple communication lines 28 and communication lines 16. Diodes 86 and 92 couple communication lines 16 with the gate terminals of SCR 80 and SCR 82, respectfully, in order to trigger SCR 80 and SCR 82 when the appropriate direction of current is observed in communication lines 16. Resistors 96 and 98 provide the same energy limiting characteristics in this circuit as resistors 40 and 42 provide in FIG. 7. Operation of control module 14 in FIG. 8 is identical to the operation of control module 14 in FIG. 7.

Figure 9:
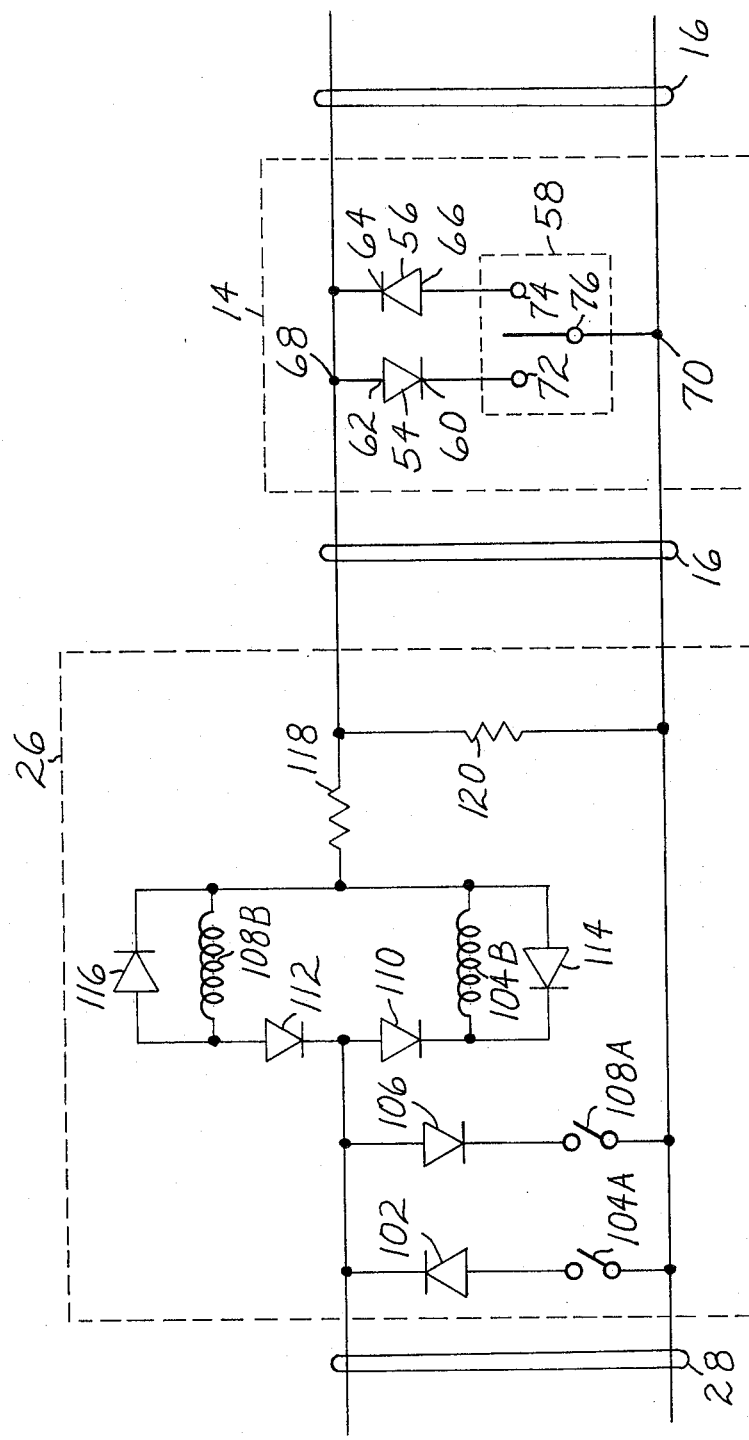
FIG. 9 is a schematic representation of a switch module utilizing two relays and a control module as in FIG. 7.

FIG. 9 illustrates another system for remotely controlling the transformer relay 12. A switch module 26 provides selective unidirectional current flow as in FIGS. 7 and 8 by utilizing separate normally open relays. Control module 14 is the same control module 14 described in FIGS. 7 and 8. In switch module 26, diode 102 is coupled in series with contact 104A of relay 104 and diode 106 is coupled in series with contact 108A of relay 108, both across communication lines 28. Diodes 102 and 106 have opposite polarities allowing the selective orientation of current in communication lines 28 and hence in the secondary winding of the transformer relay 12. Diode 110 is used in series with coil 104B of relay 104 so that relay 104 will operate when current flows in one direction in communication lines 16. Diode 112 is utilized in series with coil 108A of relay 108. Thus relay 108 will activate when current in the other direction is present. Diodes 114 and 116 are utilized in parallel with relay coils 104B and 108B respectively to absorb the inductive voltage kick of relay coils 104B and 108B when the current through them is attempted to be discontinued. Again, resistors 118 and 120 provide a voltage division energy limiting control to the output of communication lines 16. Control module 14 operates identically with the control module 14 described in FIGS. 7 and 8.

Figure 10:
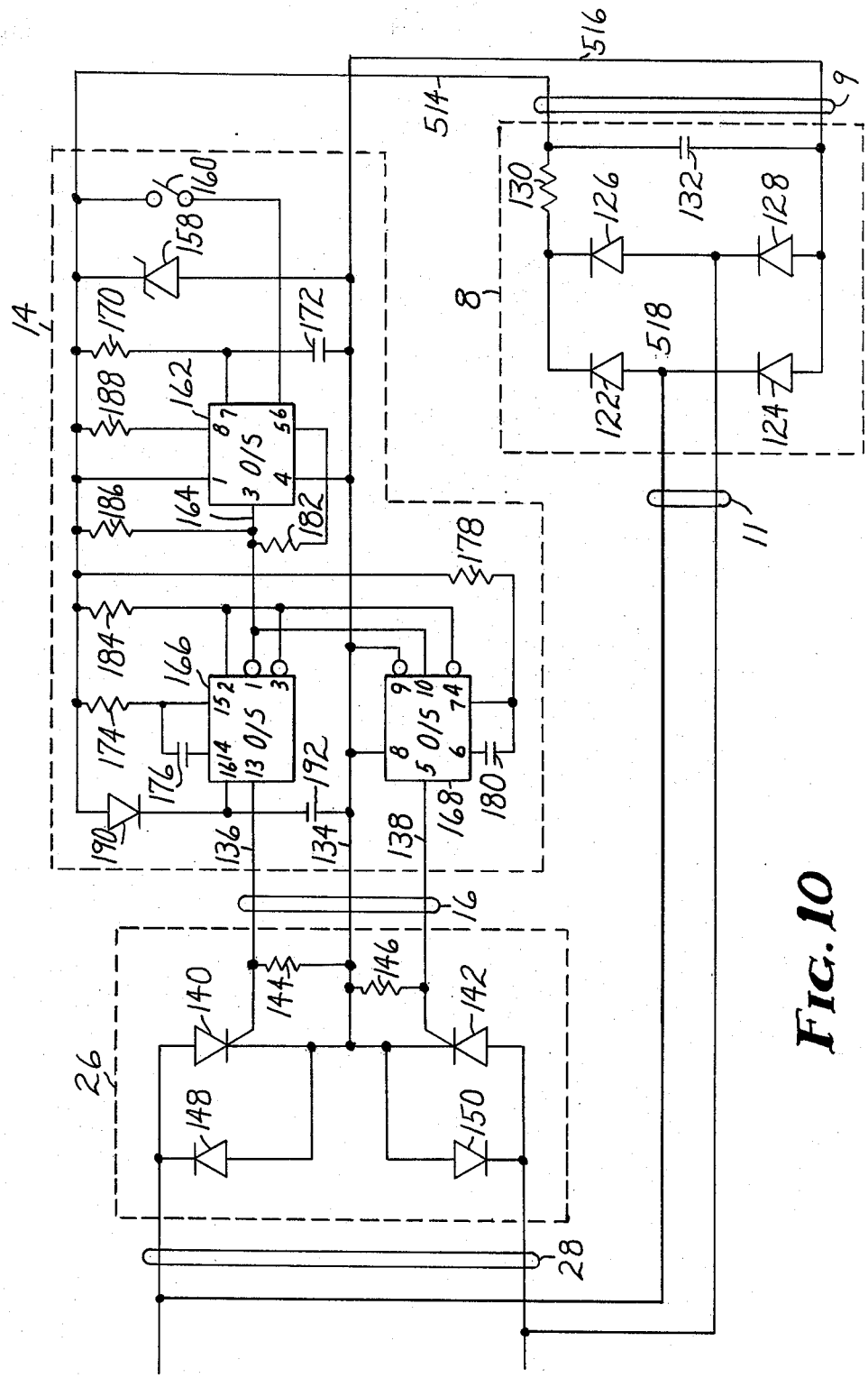
FIG. 10 is a schematic representation of a switch module utilizing two silicon controlled rectifiers with three wire control coupled to a control module utilizing timing characteristics and having a separate power supply.

FIG. 10 illustrates a system for remotely controlling the transformer relay 12 which includes power supply 8 for the control module 14. Thus, control module 14 may operate utilizing a direct current power source rather than the alternating current power source available to it from switch module 26. Interface lines 11 connect directly to the secondary winding of the transformer relay 12 while interface lines 9 couple to the control device 14 and provide it with DC power. Diodes 122, 124, 126 and 128 provide a full wave rectification of the alternating current power present on communication lines 11. Resistor 130 and capacitor 132 provide a ripple filter and limit the inrush current. The power lines 9 are supplied to the control module 14 with power line 514 and power reference 516.

The switch module 26 of FIG. 10 has differing control signal characteristics than the switch modules 26 previously illustrated in FIGS. 7, 8, and 9. Instead of a two-wire interface with the control module 14 utilizing a polarity of current for the appropriate control signal, the communication lines 16 illustrated in FIG. 10 utilize three wires with wire 134 representing a reference and the control signal being a voltage and current present at either control line 136 or control line 138. SCRs 140 and 142 have anodes individually coupled to the communication lines 28 and have cathodes coupled to reference line 134. The gate terminal to SCR 140 is coupled to control line 136 and referenced through resistor 144 back to reference line 134. Similarly, the gate terminal to SCR 142 is coupled to control line 138 while being referenced through resistor 146 back to reference line 134. Diodes 148 and 150 provide a current path for SCR 142 and 140, respectively, back to the communication lines 28 and ultimately back to the secondary winding 34 to the transformer relay 12. This switch module 26 is useful in controlling a two-wire transformer relay 12 with a three wire control module 14.

The control module 14 illustrated in FIG. 10 is coupled to a switch module 26 which has a three wire amplitude control. The control module 14 involves the use of solid-state timers. The control module 14 receives its power from power lines 9 represented by power line 514 and power reference 516. A zener diode 158 serves to stabilize the power supply. A contact switch 160 serves to activate a monostable multivibrator, a one-shot, 162. The output 164 of the one-shot 162 is coupled to the inputs of one-shots 166 and 168. One-shot 168 is activated when output 164 of one-shot 162 is activated and one-shot 166 is activated when the output 164 of one-shot 162 is deactivated. Resistor 170 and capacitor 172 provide timing considerations for a one-shot 162, resistor 174 and capacitor 176 provide timing considerations for one-shot 166 and resistor 178 and capacitor 180 providing timing considerations for one-shot 168. With the appropriate selection of values, a preferred embodiment of the timer has the time duration of one-shot 162 being relatively long compared to the duration of one-shots 166 and 168. As a result, when one-shot 162 is activated by switch 160, output 164 activates one-shot 168. The output of a one-shot 168 is coupled to control signal line 138. The short duration of one-shot 168 provides a momentary control signal to the switch module 26 to control the transformer relay 12. Similarly, when the output 164 of one-shot 162 is deactivated, one-shot 166 is activated, and its output is coupled to control signal line 136 providing a momentary response on that signal controlling the transformer relay to its opposite state. Resistors 182, 184, 186 and 188 as well as diode 190 and capacitor 192 provide the remaining connections for this control module 14. This circuit is useful for providing a time delayed turn-off of a load 10 switched by a transformer 12.

Figure 11:
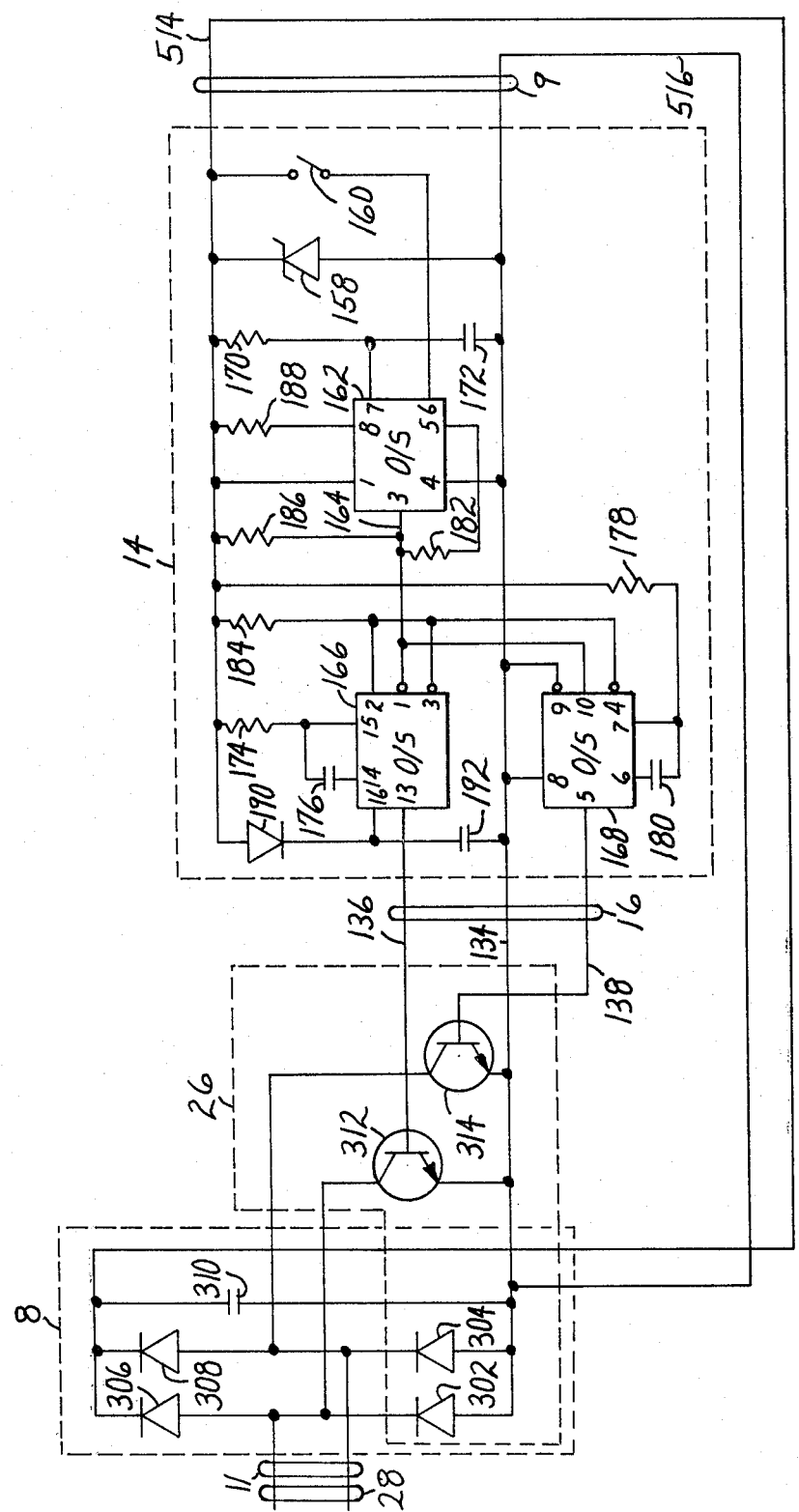
FIG. 11 is a schematic representation of a switch module utilizing two transistors and the same control module as in FIG. 10.

FIG. 11 illustrates a system for remotely controlling a transformer relay 12 with a switch module 26 having dual transistors, a power supply 8 providing full wave rectification and a control module 14 as in FIG. 10. The power supply 8 is coupled directly to the secondary winding in the transformer relay 12 with communication lines 28. The power supply 8 provides full wave rectification using diodes 302, 304, 306 and 308. Capacitor 310 provides a filter for the full wave rectified power supplied to the control module 14 on power lines 9.

The switch module 26 in FIG. 11 is comprised simply of transistor 312 and transistor 314. Transistor 312 is connected from one side of communication lines 28 to the power reference line 516 of power lines 9. This line also serves as reference line 134 for the control signal coming from the control module. Transistor 314 is connected from the other side of communication lines 28 also to power reference line 516 and reference line 134. The base of transistor 312 is coupled to control line 136 and the base of transistor 314 is coupled to control line 138. In this configuration transistors 312 and 314 of switch module 26 utilize diodes 302 and 304 of the power supply 8 as part of the switch module circuitry. Diodes 302 and 304 operate as a part of power supply 8 to provide the full wave rectification to power lines 9. Diodes 302 and 304 also operate as part of switch module 26 to be coupled in series with the emitters of transistors 312 and 314 to serve as current directors back to communication lines 28 and to protect the transistors 312 and 314 from reverse breakdown when the transistors turn off. This circuit may of course be constructed without control reference line 134 and power reference line 516 being common, and having diodes 302 and 304 duplicated once each in power supply 8 and switch module 26. The control module 14 illustrated in FIG. 11 is the same control module illustrated and described in FIG. 10 and performs the same function in the same manner.

Figure 12:
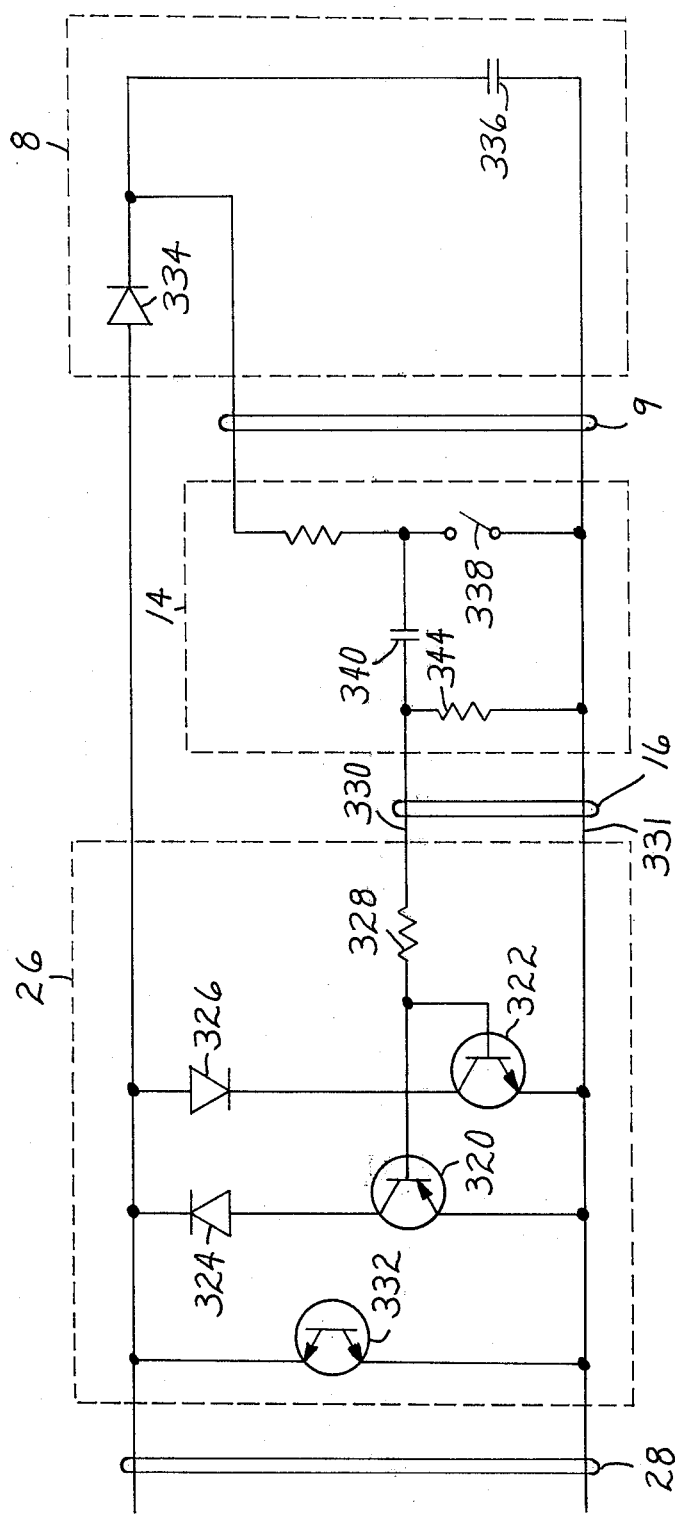
FIG. 12 is a schematic representation of a switch module utilizing two transistors and having a contact closure control module.

FIG. 12 illustrates a system for remotely controlling the transformer relay 12 using a switch module which has dual transistors and a contact closure control module 14. Power is supplied from the secondary winding 34 of the transformer relay 12 through communication lines 28 to the switch module 26 and through power supply 8 to the control module 14.

In switch module 26 transistors 320 and 322 are connected in series with diodes 324 and 326 respectively, and are coupled across communication lines 28 to provide selective unidirectional current flow in either direction through the secondary winding 34. Transistor 320 is a PNP transistor and transistor 322 is a NPN transistor. The use of complimentary transistors enables referencing the bases of the transistors to a common reference 331. The bases of transistors 320 and 322 are coupled together through resistor 328 to control signal line 330. A positive voltage present on control line 330 will activate NPN transistor 322 while a negative voltage present on control line 330 will activate PNP transistor 320. The communication lines 28 connect the secondary winding 34 of the transformer relay 12 to the switch module 26. Communication lines 16 connect the switch module 26 to the control module 14. Common reference 331 provides a reference for control line 330 and provides a return for power supply 8. Diode 324 is coupled in series with the collector of transistor 320 to protect transistor 320 against reverse breakdown when transistor 320 turns off. Similarly diode 326 is coupled in series with the collector of transistor 322 and similarly protects transistor 322 from reverse breakdown when transistor 322 turns off. Diac 332 is coupled across communication lines 28 and protects both transistors 320 and 322 from forward breakdown due to transients which may occur on communication lines 28 when the transformer relay 12 is switched.

Diode 334 in power supply 8 of FIG. 12 provides half wave rectification for the alternating current power present on communication lines 28. Capacitor 336 provides a filter for that half wave rectified power. The resultant power is supplied to control module 14 along power lines 9.

With reference to the control module 14 in FIG. 12, when contact switch 338 is open, capacitor 340 will charge through resistors 342 and 344 to a positive potential. When contact switch 338 is then closed, capacitor 340 will begin to discharge since the voltage to it will decrease; however, the voltage across capacitor 340 cannot change instantaneously and that creates a negative voltage present on control line 330 signaling switch module 26 to conduct in one direction (activating PNP transistor 320). After contact switch 338 has been closed for some time, and capacitor 340 is allowed to discharge the voltage present on control line 330 will return to zero. When contact 338 is then opened, capacitor 340 will begin to charge again, however, since the voltage across capacitor 340 cannot change instantaneously, this will create a positive voltage level on control line 330 indicating that switch module 26 should conduct in the other direction (activating NPN transistor 322). After capacitor 340 is allowed to charge, the voltage present on control line 330 will again return to zero. Thus, a momentary control signal is sent from control module 14 to switch module 26 whenever a transistion occurs in the position of contact switch 338. Care must be taken in the selection of the component values for the control module 14 in that the half wave power passing through diode 334 and resistor 342 when in contact with switch 338 is closed, must be less than the threshold current of the secondary winding 34 of the transformer relay 12.

Figure 13:
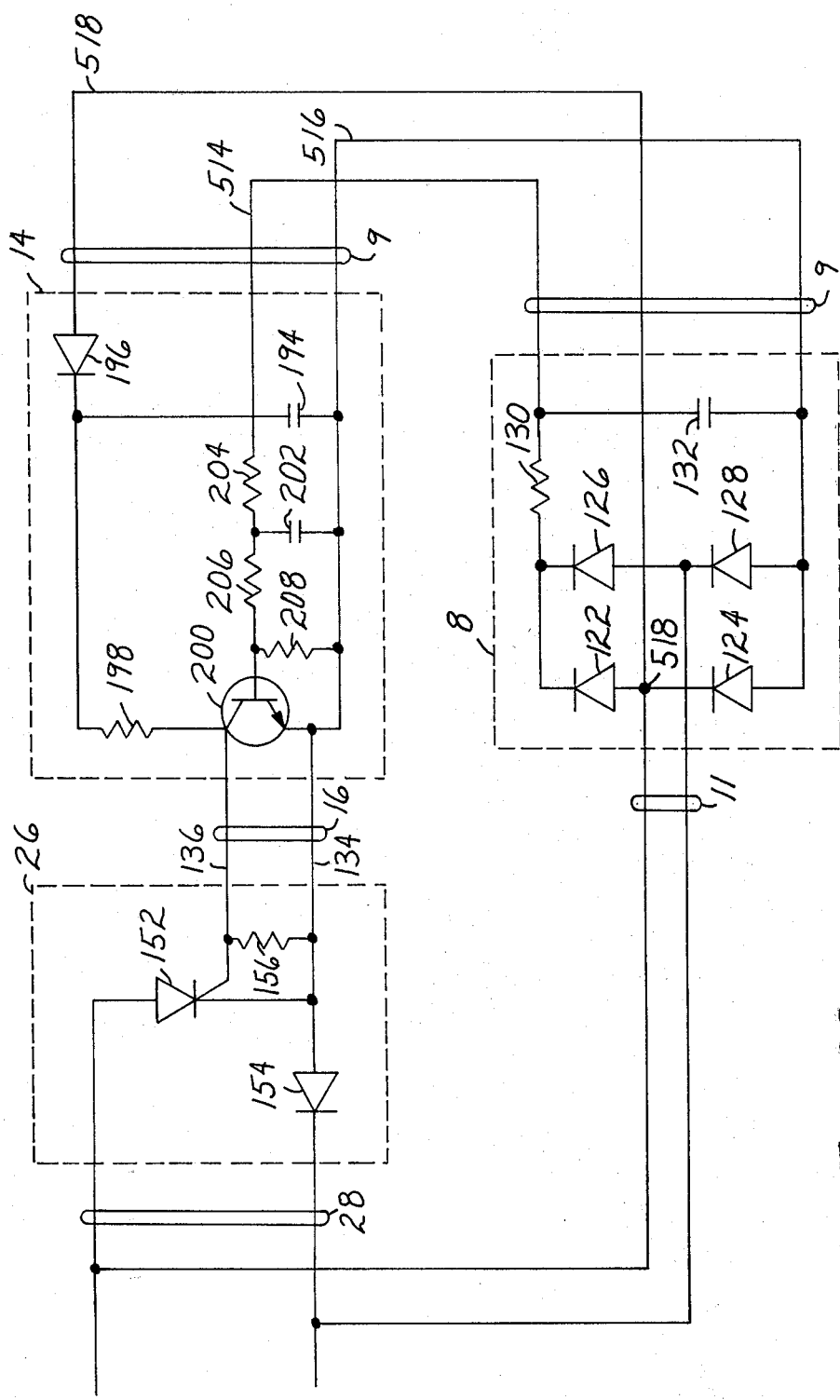
FIG. 13 is a schematic representation of a switch module providing unidirectional switching coupled to a separately powered control module providing blackout protection.

FIG. 13 illustrates a system for remotely controlling the transformer relay 12 in which only a unidirectional control is required. A unidirectional switch module 26 is provided, and control module 14 is supplied with power from power supply 8.

Switch module 26 of FIG. 13 may be utilized where only unidirectional control of the current of the secondary winding 34 of the transformer relay 12 is required. SCR 152 is coupled in series with diode 154 across communication lines 28. The gate terminal to SCR 152 is connected to control line 136 and to resistor 156 which is also coupled to reference line 134 and to the cathode of SCR 152. When the appropriate signal is present on control line 136 with respect to reference line 134, a voltage will be present across resistor 156 and at the gate terminal to SCR 152. SCR 152 will then conduct through diode 154 and create a unidirectional current flow in communication lines 28 and hence in the secondary winding 34 of the transformer relay 12. Diode 154 may be required where a control module 14 is utilized with a power supply 8 as in FIG. 13 in order to provide a current return from reference line 134 to the secondary winding 34.

Power supply 8 is identical to the power supply 8 described in FIG. 10. The control module 14 of FIG. 13 is complimentary to switch module 26 and activates only a unidirectional switch module 26. Since only unidirectional control is necessary, only two wires are necessary on communication lines 16; namely, control signal line 136 and reference line 134. The control module 14 obtains its power on power lines 9 from power supply 8. Power line 514 and power reference line 516 couple the power supply 8 and the control module 14 as in FIG. 10. In addition, switch module 14 in FIG. 13 is coupled to point 518 an intermediate point in the full wave rectifier of power supply 8. The circuitry of control module 14 operates to supply control on control line 136 when power is applied to the control module 14. Such a control module 14 is useful as a blackout protector to de-energize a load when power is suddenly applied to the transformer relay 12. Similarly, such a control circuit could be used to energize a transformer relay 12 when power is applied after an outage. When power is applied, capacitor 194 charges through diode 196 very rapidly since the only limiting impedance is the internal impedance of the secondary winding 34 of the transformer relay 12. The charging of capacitor 194 supplies a voltage through resistor 198 to the collector of transistor 200. Capacitor 202, on the other hand, charges much more slowly since it must charge through resistor 204. While capacitor 202 is charging, resistors 206 and 208 bias transistor 200 in its "off" condition allowing a voltage to be supplied to control line 136. When capacitor 202 is fully charged, transistor 200 turns "on" discontinuing the voltage present on control line 136. Thus, the control module 14 in FIG. 13 provides a momentary control signal in one direction when power is applied to the circuit.

Figure 14:
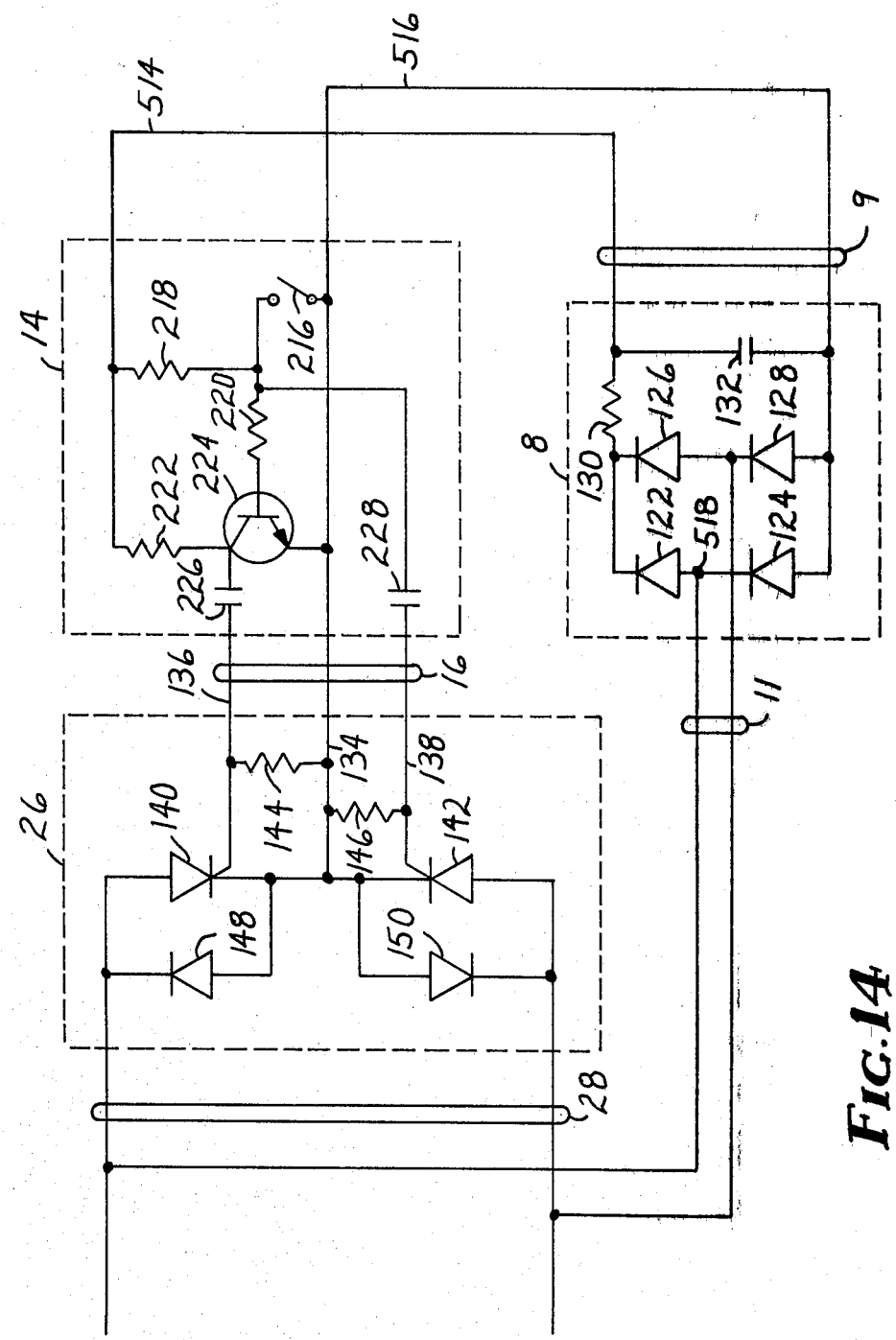
FIG. 14 is a schematic representation of a switch module utilizing two silicon controlled rectifiers with three wire control coupled to a separately powered control module utilizing a single throw switch.

FIG. 14 illustrates a system for remotely controlling the transformer relay utilizing a control module 14 supplying a three wire control signal to switch module 26 and having a single active component in control module 14. The switch module 26 in FIG. 14 is identical to the switch module 26 illustrated and described in FIG. 10 and the power supply 8 is identical to the power supply 8 illustrated and described in FIG. 10 and FIG. 13.

The control module 14 of FIG. 14 is coupled to switch module 26 through communication lines 16 represented by control line 136, reference line 134 and control line 138. The device is powered from power supply lines 9 represented by power line 514 and power reference 516. The control module 14 is controlled entirely by the single contact closure switch 216 which, through biasing resistors 218, 220 and 222 controls transistor 224 either on or off and produces through capacitors 226 and 228 a signal on control lines 136 and 138, respectively. The control module 14 operates to produce a momentary control signal on either control line 136 or control line 138 by operation of a single pole, single throw contact closure switch 216 and a single active semi-conductor (transistor 224). Thus, this control module 14 may be utilized with existing common place lighting switches.

Figure 15:
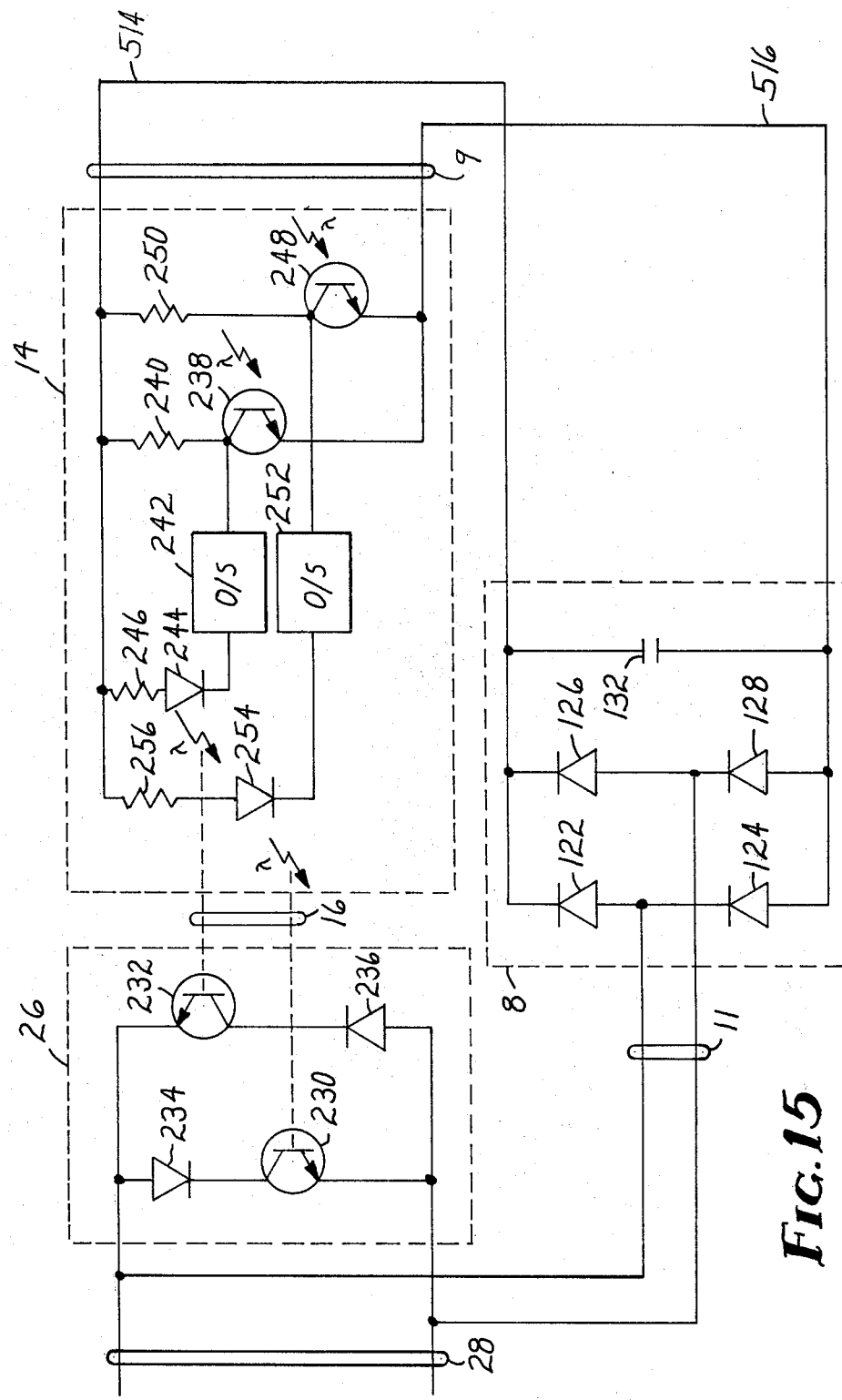
FIG. 15 is a schematic representation of an optically coupled control module and switch module with the switch module utilizing two phototransistors and the separately powered control module utilizing light as an external stimula.

FIG. 15 illustrates a system for remotely controlling a transformer relay illustrating that the communication lines 16 may take other forms than those previously described. The switch module 26 and the control module 14 are optically coupled. Thus, communication lines 16 take the form of optical coupling between the control module 14 and the switch module 26. The switch module 26 is coupled to the transformer relay 12 by communication lines 28. Light from the control module 14 is received by either phototransistor 230 or 232 activating the selected one. The selected phototransistor, 230 or 232, then conducts through diode 234 or 236 respectively, controlling the current in the communication lines 28 in one direction or the other. The control module 14 is activated by light hitting a phototransistor 238 or 248. Phototransistor, 238 or 248, biased through resistor, 240 or 250, respectively, is activated, which in turn activates one-shot, 242 or 252. The output of one-shot, 242 or 252, turns on light emitting diode, 244 or 254, through resistor 246 or 256 creating an optical pulse on communication lines 16. Control module 14 is powered from a separate power supply 8 over power lines 9. Power supply 8 is identical to the power supply previously illustrated and described in FIGS. 10, 13 and 14.

While the system illustrated in FIG. 15 illustrates circuitry operating with external optical stimula, it is understood that other systems may be constructed utilizing other forms of external stimula. Other stimula which may be used include, but are not limited to, infrared, thermal, ultrasonic, and microwave.

Figure 16:
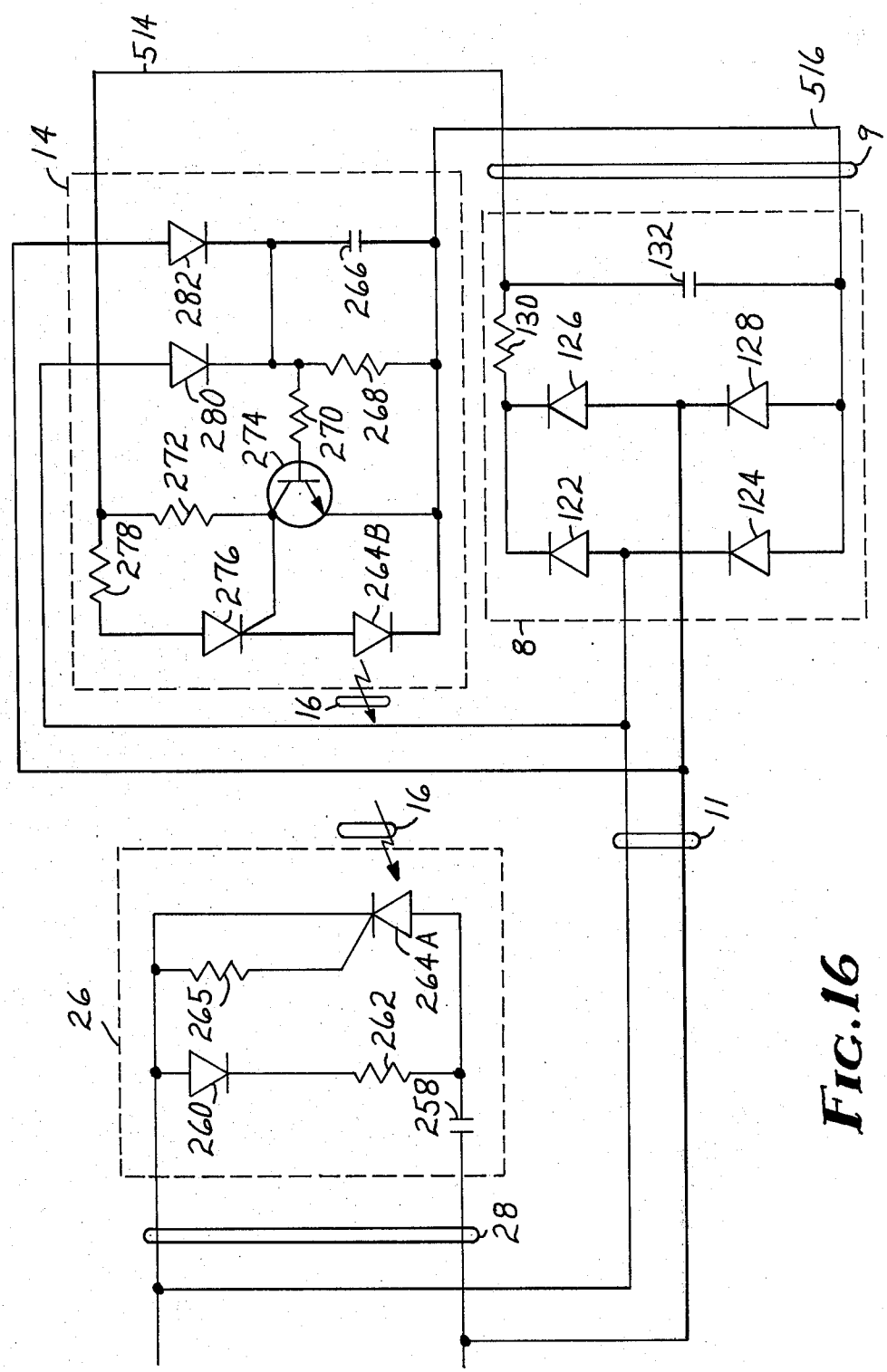
FIG. 16 is a schematic representation of a system providing unidirectional switching and a separately powered control module.

FIG. 16 illustrates a system for remotely controlling a transformer relay 12 showing a unidirectional switch module 26 optically coupled to a unidirectional control module 14. The control module 14 is powered from external power supply 8 in a conventional manner. The system in FIG. 16 may be utilized to power down a selected load by turning transformer relay 12 off if power to the transformer relay 12 should be interrupted for some reason.

Switch module 26 in FIG. 16 is coupled to the secondary winding 34 of the transformer relay 12 along communication lines 28. The capacitor 258 is charged through diode 260 and resistor 262 while power is present. The value of resistor 262 is chosen to limit the amount of current flow in the secondary winding 34 to a level below that needed to switch the load switch 36 of transformer relay 12. When the control module 14 senses that power to the transformer relay has been interrupted, it turns on the light emitting diode 264B of optoisolator 264, the photo SCR receiving portion of which is illustrated as reference numeral 264A, and having a gate terminal biased by resistor 265. The conduction of the photo SCR portion 264A allows capacitor 258 to discharge its energy through communication lines 28 through the secondary winding 34 of the transformer relay 12 turning the transformer relay 12 off without the need for primary exitation power on the primary winding 32 of the transformer relay 12.

The control module 14 in FIG. 16 receives power from two sources. It receives direct current power from the power supply 8 along power supply lines 9 illustrated by power line 514 and power reference line 516. The control module 14 also receives power direct from the secondary winding 34 of the transformer relay 12 along power lines 11. When power is applied to the control module 14, capacitor 266 is charged which, through biasing resistors 268, 270 and 272, keeps transistor 274 saturated. When power from supply lines 11 is removed from the circuit, capacitor 266 discharges quite rapidly, turning transistor 274 off which increases the voltage at the gate of SCR 276. The current through SCR 276 and resistor 278 turns on the light emitting diode portion 264B of an optoisolator. The resulting optical signal represents the communication along communication lines 16. Diodes 280 and 282 along with diodes 124 and 128 of power supply 8 of FIG. 12 provide full wave rectification of the alternating current power present on power lines 11.

A listing of exemplary component values, part numbers and manufacturing source are provided in Table I.

TABLE I

| Reference Numeral | Kind | Part Number or size | Manufacturer |
|---|---|---|---|
| 38 | triac | L200E3 | Teccor |
| 40 | resistor | 3.6 kilohms | |
| 42 | resistor | 20 kilohms | |
| 54 | diode | 1N4004 | |
| 56 | diode | 1N4004 | |
| 80 | SCR | ID104 | Unitrode |

TABLE I-continued

| Reference Numeral | Kind | Part Number or size | Manufacturer |
|---|---|---|---|
| 82 | SCR | ID104 | Unitrode |
| 84 | resistor | 22 kilohms | |
| 86 | diode | 1N4004 | |
| 88 | diode | 1N4004 | |
| 90 | resistor | 22 kilohms | |
| 92 | diode | 1N4004 | |
| 94 | diode | 1N4004 | |
| 96 | resistor | 3.6 kilohms | |
| 98 | resistor | 36 kilohms | |
| 102 | diode | 1N4004 | |
| 104 | relay | MRB1A12 | Clare |
| 106 | diode | 1N4004 | |
| 108 | relay | MRB1A12 | Clare |
| 110 | diode | 1N4004 | |
| 112 | diode | 1N4004 | |
| 114 | diode | 1N4004 | |
| 116 | diode | 1N4004 | |
| 118 | resistor | 3.6 kilohms | |
| 120 | resistor | 36 kilohms | |
| 122 | diode | 1N4004 | |
| 124 | diode | 1N4004 | |
| 126 | diode | 1N4004 | |
| 128 | diode | 1N4004 | |
| 130 | resistor | 1 kilohm | |
| 132 | capacitor | 100 microfarads | |
| 140 | SCR | ID104 | Unitrode |
| 142 | SCR | ID104 | Unitrode |
| 144 | resistor | 22 kilohms | |
| 146 | resistor | 22 kilohms | |
| 148 | diode | 1N4004 | |
| 150 | diode | 1N4004 | |
| 152 | SCR | ID104 | Unitrode |
| 154 | diode | 1N4004 | |
| 156 | resistor | 22 kilohms | |
| 158 | zener diode | 1N4742 | |
| 162 | long range timer | XR2242 | Exar |
| 166 | monostable multivibrator | 74C221 | National Semiconductor |
| 168 | monostable multivibrator | 74C221 | National Semiconductor |
| 170 | resistor | 100 kilohms | |
| 172 | capacitor | 100 microfarads | |
| 174 | resistor | 100 kilohms | |
| 176 | capacitor | 1 microfarad | |
| 178 | resistor | 100 kilohms | |
| 180 | capacitor | 1 microfarad | |
| 182 | resistor | 51 kilohms | |
| 184 | resistor | 10 kilohms | |
| 186 | resistor | 10 kilohms | |
| 188 | resistor | 20 kilohms | |
| 190 | diode | 1N4004 | |
| 192 | capacitor | 1 microfarad | |
| 194 | capacitor | 100 microfarads | |
| 196 | diode | 1N4004 | |
| 198 | resistor | 220 kilohms | |
| 200 | transistor | 2N2222 | |
| 202 | capacitor | 15 microfarads | |
| 204 | resistor | 100 kilohms | |
| 206 | resistor | 16 kilohms | |
| 208 | resistor | 22 kilohms | |
| 218 | resistor | 18 kilohms | |
| 220 | resistor | 100 kilohms | |
| 222 | resistor | 18 kilohms | |
| 224 | transistor | 2N2222 | |
| 226 | capacitor | 2.2 microfarads | |
| 228 | capacitor | 2.2 microfarads | |
| 230/244 | optocoupler | 4N31 | |
| 232/254 | optocoupler | 4N31 | |
| 234 | diode | 1N4004 | |
| 236 | diode | 1N4004 | |
| 238 | phototransistor | OP500 | Optron |
| 240 | resistor | 2.5 kilohms | |
| 242 | monostable multivibrator | 74121 | National Semiconductor |
| 246 | resistor | 0.3 kilohms | |
| 248 | phototransistor | OP500 | Optron |
| 250 | resistor | 2.5 kilohms | |
| 252 | monostable multivibrator | 74121 | National Semiconductor |

TABLE I-continued

| Reference Numeral | Kind | Part Number or size | Manufacturer |
|---|---|---|---|
| 256 | resistor | 0.3 kilohms | |
| 258 | capacitor | 250 microfarads | |
| 260 | diode | 1N4004 | |
| 262 | resistor | 22 kilohms | |
| 264 | optoisolator | H74C1 | General Electric |
| 266 | capacitor | 10 microfarads | |
| 268 | resistor | 10 kilohms | |
| 270 | resistor | 47 kilohms | |
| 272 | resistor | 100 kilohms | |
| 274 | transistor | 2N2222 | |
| 276 | SCR | ID104 | Unitrode |
| 278 | resistor | 0.1 kilohms | |
| 280 | diode | 1N4004 | |
| 282 | diode | 1N4004 | |
| 302 | diode | 1N4004 | |
| 304 | diode | 1N4004 | |
| 306 | diode | 1N4004 | |
| 308 | diode | 1N4004 | |
| 310 | capacitor | 100 microfarads | |
| 312 | transistor | 2N2222 | |
| 314 | transistor | 2N2222 | |
| 320 | transistor(PNP) | 2N2907 | |
| 322 | transistor(NPN) | 2N2222 | |
| 324 | diode | 1N4004 | |
| 326 | diode | 1N4004 | |
| 328 | resistor | 6.2 kilohms | |
| 332 | diac | GT32 | Teccor |
| 334 | diode | 1N4004 | |
| 336 | capacitor | 10 microfarads | |
| 340 | capacitor | 10 microfarads | |
| 342 | resistor | 4.7 kilohms | |
| 344 | resistor | 4.7 kilohms | |

Thus, it can be seen that there has been shown and described a novel switching system for controlling a transformer relay. It is to be understood, however, that various changes, modifications, and substitutions in the form of the details of the described apparatus can be made by those skilled in the art without departing from the scope of the invention as defined by the following claims.

What is claimed is:

1. A system for controlling a transformer relay in response to a stimulus, said transformer relay having a primary winding coupled to an energy source, having a load switch adapted to control the application of said energy source to a load, and having a secondary winding which controls said load switch depending upon the unidirectional flow of current above a predetermined threshold in said secondary winding, comprising:
    a switching means coupled to said secondary winding with two wires for allowing, in response to a control signal, a unidirectional current flow in said secondary winding of an amount exceeding said threshold in said secondary winding; and
    a control means operatively coupled to said switching means for momentarily producing said control signal in response to said stimulus;
    said switching means and said control means being powered from said secondary winding, drawing a quiescent current of an amount less than said threshold from said secondary winding;
    whereby said transformer relay is controlled utilizing only two wires between said secondary winding and said switching means and whereby said control signal may be a signal other than a unidirectional current flow.

2. A system as in claim 1 wherein a plurality of said control means are operatively coupled in parallel with each other whereby said transformer relay may be controlled from any one of said plurality of said control means.

3. A system as in claim 1 wherein a plurality of said switching means are operatively coupled in parallel with each other, each of said plurality of said switching means having an associated control means whereby said transformer relay may be controlled from any one of said associated control means.

4. A system as in claim 1 wherein said switching means has the capability of allowing unidirectional current flow in either direction selectively in said secondary winding of said transformer relay.

5. A system as in claim 4 wherein said switching means comprises a bidirectional switch coupled across said secondary winding of said transformer relay.

6. A system as in claim 5 wherein said switching means and said control means are coupled with two wires and wherein said control signal comprises a unidirectional current flow in a loop formed with said two wires, said unidirectional current flow being in either direction selectively.

7. A system as in claim 6 wherein said bidirectional switch is a triac.

8. A system as in claim 6 wherein said bidirectional switch comprises a pair of silicon controlled rectifiers coupled in parallel in opposite directions.

9. A system as in claim 6 wherein said bidirectional switch comprises a parallel coupling of a pair of relays each coupled in series with a diode, said diodes oriented in opposite directions.

10. A system as in claim 5 wherein said control signal is a voltage level on a plurality of wires interconnecting said switching means and said control means.

11. A system as in claim 10 wherein said control means comprises:
    a first and a second monostable multivibrator, each operatively coupled to switching means, said first monostable multivibrator for producing said control signal causing said switching means to control the current in said secondary winding in a first direction and said second monostable multivibrator for producing said control signal causing said interface means to control the current in said secondary winding in a second direction, said first and second monostable multivibrators having a relatively short time constant;
    a third monostable multivibrator having an output coupled to said first and said second monostable multivibrator activating said first monostable multivibrator when said third monostable multivibrator commences its astable state and activating said second monostable multivibrator when said third monostable multivibrator terminates its astable state, said third monostable multivibrator having a relatively long time constant; and
    an activating input coupled to said third monostable multivibrator for activating said third monostable multivibrator;
    whereby said transformer relay may be controlled in a first direction when said activating input is activated and controlled in a second direction when said third monostable multivibrator returns to its stable state; said first and second monostable multivibrators providing a momentary control of said interface means.

12. A system as in claim 10 wherein said control means comprises:

a first capacitor and a second capacitor selectively coupled to said plurality of wires;

a switch; and a transistor coupled to said switch and to said first capacitor and said second capacitor, said transistor operating in a first state when said switch is open and operating in a second state when said switch is closed;

said control signal momentarily being in a first state when said transistor switches to said first state and momentarily being in a second state when said transistor switches to said second state;

whereby said transformer relay may be controlled by the opening and closing of said switch.

13. A system as in claim 10 wherein said bidirectional switch comprises a pair of transistors coupled in parallel in opposite directions.

14. A system as in claim 5 wherein said control signal is optical.

15. A system as in claim 14 wherein said bidirectional switch comprises a parallel coupling of a pair of phototransistors and wherein said control means comprises an appropriately biased light emitting diode coupled to a momentary switch with a monostable multivibrator.

16. A system as in claim 5 wherein said bidirectional switch comprise:

a pair of transistors, each having a collector, a base and an emitter, said collectors and said emitters being coupled in opposite directions across said secondary winding; and a pair of diodes, one of said pair of diodes coupled in series with said collector of each of said pair of transistors, the direction of each of said pair of diodes matching its associated transistor; and wherein said control means comprises:

a half-wave rectifier coupled to said secondary winding;

a contact coupled to said half-wave rectifier; and a capacitor coupled to said half-wave rectifier and to said contact and coupled to each said base of said pair of transistors;

said capacitor momentarily providing said control signal to said pair of transistors and responsive to said contact.

17. A system as in claim 1 which further comprises a power supply having an input and an output, said input coupled to said secondary winding and said output coupled to said control means, for converting the alternating current present at said secondary winding to an energy source useable by said control means.

18. A system as in claim 17 wherein a plurality of said control means are operatively coupled to said switching means and wherein said output of said power supply is coupled to said plurality of said control means.

19. A system as in claim 17 wherein said control signal is a voltage level on a plurality of wires interconnecting said switching means and said control means.

20. A system as in claim 19 wherein said control means comprises:

a first and a second monostable multivibrator, each operatively coupled to switching means, said first monostable multivibrator for producing said control signal causing said switching means to control the current in said secondary winding in a first direction and said second monostable multivibrator for producing said control signal causing said interface means to control the current in said secondary winding in a second direction, said first and second monostable multivibrators having a relatively short time constant;

a third monostable multivibrator having an output coupled to said first and said second monostable multivibrator activating said first monostable multivibrator when said third monostable multivibrator commences its astable state and activating said second monostable multivibrator when said third monostable multivibrator terminates its astable state, said third monostable multivibrator having a relatively long time constant; and an activating input coupled to said third monostable multivibrator for activating said third monostable multivibrator;

whereby said transformer relay may be controlled in a first direction when said activating input is activated and controlled in a second direction when said third monostable multivibrator returns to its stable state; said first and second monostable multivibrators providing a momentary control of said interface means.

21. A system as in claim 19 wherein said control means comprises:

a first capacitor and a second capacitor coupled to said plurality of wires;

a switch; and a transistor coupled to said switch and to said first capacitor and said second capacitor, said transistor operating in a first state when said switch is open and operating in a second state when said switch is closed;

said control signal momentarily being in a first state when said transistor switches said first state and momentarily being in a second state when said transistor switches to said second state;

whereby said transformer relay may be controlled by the opening and closing of said switch.

22. A system as in claim 17 wherein said control signal is optical.

23. A system as in claim 22 wherein said bidirectional switch comprises a parallel coupling of a pair of phototransistors and wherein said control means comprises an appropriately biased light emitting diode coupled to a momentary switch with a monostable multivibrator.

24. A system as in claim 1 wherein said switching means has the capability of allowing a unidirectional current flow in said secondary winding in an amount exceeding said threshold in one direction only.

25. A system as in claim 24 wherein said switching means comprises a unidirectional switch coupled across said secondary winding of said transformer relay.

26. A system as in claim 25 wherein said switching means comprises;

a silicon controlled rectifier having load terminals coupled across said secondary winding and having a gate terminal; and a resistor coupled between said gate terminal and one side of said secondary winding, said control signal being supplied across said resistor; and wherein said control means comprises:

a transistor having an output coupled to said control signal and having an input;

a first charging circuit coupled to said transistor activating said transistor as said first charging circuit becomes charged, said first charging circuit having a relatively short time constant; and a second charging circuit coupled to said transistor deactivating said transistor when said second charging circuit becomes charged, said second charging circuit having a relatively long time constant;

whereby said transistor is activated by said first charging circuit when said control means is energized and subsequently deactivated by said second charging circuit; and whereby said transformer relay may be automatically set to a first state upon energization.

27. A system as in claim 25 wherein said control means comprises:
a full-wave rectifier coupled to said secondary winding;
a first capacitor coupled across said full-wave rectifier;
a resistor;
a transistor having a base, a collector, and emitter, said transistor having said collector coupled through said resistor to one side of said first capacitor and said emitter coupled to the other side of said capacitor;
a second capacitor coupled to said base of said transistor;
a silicon controlled rectifier and a light emitting diode coupled across said first capacitor said light emitting diode producing light as said control signal;
the time constant for said first capacitor being substantially longer than the time constant associated with said second capacitor;
whereby, with power on, said first capacitor and said second capacitor are fully charged but when said power is removed from said secondary winding, said second capacitor discharges more quickly than said first capacitor causing said transistor to turn off firing said silicon controlled rectifier and activitating said light emitting diode; and
wherein said switching means comprises: an optically activated silicon controlled rectifier coupled in series with a capacitor both of which are coupled across said secondary winding;
a resistor and a diode coupled in parallel with said optically activated silicon controlled rectifier and oriented opposite to said optically controlled rectifier;
whereby when said light emitting diode of said control means fires said optically activated silicon controlled rectifier is activated which discharges said third capacitor into said secondary winding of said transformer relay controlling said transformer relay to a first state.

28. A system for controlling a transformer relay having a secondary winding for controlling a load switch comprising:
a bidirectional solid state switch having load terminals coupled across said secondary winding and having a gate terminal;
energy limiting means coupled to said bi-directional solid state switch and drawing power from said secondary winding for supplying a power reduced from that power available at said secondary winding; and
current control means operatively coupled to said energy limiting means for selectively and momentarily allowing current to flow in one direction only;
whereby said transformer relay is controlled by utilizing only two wires between said secondary winding and said bidirectional solid state switch and by utilizing only two wires between said bidirectional solid state switch and said current control means; and
whereby the voltage and current present at said current control means are limited to amounts lower than that required to operate said transformer relay directly.

29. A system as in claim 28 wherein said energy limiting means is a voltage divider having an effective parallel impedance in parallel with said current control means and having an effective series impedance in series with said current control means.

30. A system as in claim 29 wherein a plurality of said current control means are operatively coupled in parallel whereby said transformer relay may be controlled from any one of said plurality of said current control means.

31. A system as in claim 29 wherein said bidirectional solid state switch is a triac.

32. A system as in claim 29 wherein said bidirectional solid state switch comprises a pair of silicon controlled rectifiers coupled in parallel in opposite directions.

33. A system as in claim 29 wherein said bidirectional solid state switch comprises a pair of transistors coupled in parallel in opposite directions.

34. A system as in claim 29 wherein said bidirectional switch comprises a parallel coupling of a pair of relays each coupled in series with a diode, said diodes oriented in opposite directions.

35. A system as in claim 29 wherein said voltage divider is chosen with said series impedance limiting the amount of current flow through said current control means to a predetermined maximum value and with the ratio of the value of said parallel impedance to the sum of the values of said parallel impedance and said series impedance to limit the amount of voltage present across said current control means to a predetermined maximum value.

36. A system as in claim 29 wherein said voltage divider comprises a first and a second resistor coupled in series with said first resistor being said series impedance and said second resistor being said parallel impedance.

37. A system as in claim 36 wherein the resistance of said first resistor is chosen such that the amount of current flowing through said current control means is limited to a predetermined maximum value and wherein the ratio of the resistance of said second resistor to the overall resistance of said first and second resistors is chosen such that the amount of voltage present across said current control means is limited to a predetermined maximum value.

38. A system for controlling a load operating at a first voltage, comprising:
a transformer relay having a primary winding coupled across said first voltage, having a second winding providing a second voltage lower than said first voltage and having a load switch coupled in series with said load, said load switch being latched to an open state when current in said secondary winding momentarily flows in one direction and being latched to a closed state when current in said secondary winding momentarily flows in the opposite direction;
a bidirectional solid state switch having load terminals operatively coupled across said secondary winding and having a gate terminal;

energy limiting means coupled to said bidirectional solid state switch and drawing power from said secondary winding for supplying a power reduced from that power available at said secondary winding; and a current control means operatively coupled to said energy limiting means for selectively and momentarily allowing current to flow in one direction only;

whereby said low voltage transformer relay is controlled by utilizing only two wires between said secondary winding and said bidirectional solid state switch and by utilizing only two wires between said bidirectional solid state switch and said current control means; and whereby the voltage and current present at said current control means are limited to amounts lower than that required to operate said transformer relay directly.

39. A system as in claim 38 wherein said energy limiting means is a voltage divider having an effective parallel impedance in parallel with said current control means and having an effective series impedance in series with said current control means.

40. A system as in claim 38 wherein said bidirectional solid state switch is a triac.

41. A system as in claim 38 wherein said bidirectional solid state switch comprises a pair of silicon controlled rectifiers coupled in parallel in opposite directions.

42. A system as in claim 39 wherein said voltage divider is chosen with said series impedance to limit the amount of current flow through said current control means to a predetermined maximum value and with the ratio of the value of said parallel impedance to the sum of the values of said parallel impedance and said series impedance to limit the amount of voltage present across said current control means to a predetermined maximum value.

* * * * *